United States Patent [19]

McKeon

[11] 4,284,911
[45] Aug. 18, 1981

[54] SWITCHING NETWORK

[75] Inventor: Edward F. McKeon, Short Hills, N.J.

[73] Assignee: RCA Corporation, New York, N.Y.

[21] Appl. No.: 58,024

[22] Filed: Jul. 16, 1979

[51] Int. Cl.³ .......................................... H03K 17/72
[52] U.S. Cl. ............................. 307/252 C; 307/252 M
[58] Field of Search ............... 307/252 C, 252 M, 305

[56] References Cited

U.S. PATENT DOCUMENTS

| | | | |
|---|---|---|---|
| 3,271,700 | 9/1966 | Gutzwiller | 307/252 C |
| 3,619,652 | 11/1971 | Ogie | 307/305 X |
| 3,638,042 | 1/1972 | Studtmann | 307/252 G |
| 4,107,552 | 8/1978 | Akamatsu | 307/252 C |

Primary Examiner—John Zazworsky
Attorney, Agent, or Firm—J. M. O'Meara; Allan J. Jacobson

[57] ABSTRACT

Within a switching network of the type wherein at least one GTO device is rendered conductive or non-conductive to control the flow of current through a load, current is drawn from the gate of the GTO device and a shunt path is connected across the main conduction path of the GTO device simultaneously in response to a turn-off signal.

3 Claims, 2 Drawing Figures

SWITCHING NETWORK

The present invention relates to a switching network of the type wherein at least one gate turn-off (GTO) device is rendered conductive or non-conductive to control the flow of current through a load. GTO devices typically include four alternate layers of P and N type semiconductor material with the outer layers being anode and cathode regions respectively, while the inner layer closer to the cathode region is a gate region to which current of opposite polarities is applied in controlling conduction between the anode and cathode regions. Such devices are commonly known as switchable rectifiers, trans switches, and gate controlled switches.

Although many switching networks of this type are known in the art, separate voltage sources are required to supply the current of opposite polarities that is applied to control the conductivity of the GTO device. Furthermore, the normally rapid response of the GTO device to a turn-off signal is reduced where the load is reactive because current flow through the main conduction path of the GTO device must be reduced to zero if such turn-off is to be accomplished.

In the switching network of the invention, the GTO device is turned off by simultaneously drawing current from its gate and connecting a shunt path across its main conduction path. In one preferred embodiment, a first semiconductor switch is disposed with its main conduction path connected to conduct current away from the gate of the GTO device and a second semiconductor switch is disposed with its main conduction path connected in parallel with the main conduction path of the GTO device, while the control electrodes of both semiconductor switches are connected to receive the turn-off signal.

Figure 1:
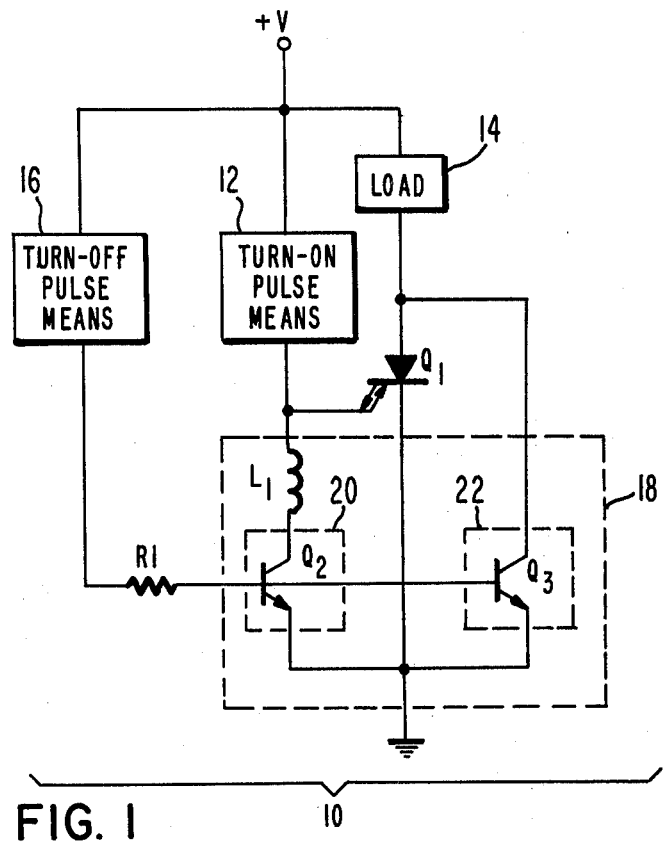
FIG. 1 shows a schematic diagram of a switching network embodying the present invention.

In FIG. 1, a switching network 10 is shown of the type wherein a turn-on signal from a pulse means 12 is directed to the gate of a GTO device $Q_1$ to energize a load 14 from a voltage source $+V$ and a turn-off signal from a pulse means 16 is directed to that gate to deenergize the load 14. As is commonly known in the electronic arts, $Q_1$ is a four layer, semiconductor structure having a gate at which positive or negative signals are applied to selectively control the conductivity of a main conduction path between an anode and a cathode. A positive gate signal renders the main conduction path of $Q_1$ conductive, while a negative gate signal renders that main conduction path non-conductive. As compared with other semiconductive switching devices such as transistors, GTO devices have very high gain, and their gate signal control is advantageous for many applications where a bipolar transistor would otherwise draw continuous base current. However, to turn $Q_1$ off, the negative gate signal must be applied thereto until current flow through the main conduction path thereof is reduced to substantially zero. Therefore, the turn-off signal must be of extended duration when the load 14 includes energy storing capacitive or inductive elements. Furthermore, the negative gate current is supplied from a voltage source additional to $+V$ in most GTO switching networks. To alleviate these problems, the switching network 10 of the invention includes a circuit means 18 for responding to a turn-off signal by simultaneously drawing current from the gate of $Q_1$ and connecting a shunt path across the main conduction path of $Q_1$.

The main conduction path of $Q_1$ is rendered conductive to draw current through the load 14 whenever the turn-on gate signal from pulse means 12 is applied. Then to render $Q_1$ non-conductive, the turn-off signal from pulse means 16 is applied to the circuit means 18 so that gate current is drawn away from $Q_1$ and the shunt path is established across the main conduction path of $Q_1$. Prior art circuitry is known wherein gate current is drawn away from a GTO device to increase the impedance through its main conduction path and thereby terminate the flow of current through a load. As the temperature of the GTO device increases, however, it becomes more difficult to turn off by only withdrawing gate current therefrom. Because the temperature of the GTO is influenced by the magnitude and duration of the load current, these parameters are of critical importance in such prior art circuitry. In the switching network 10 of the invention, when the turn-off signal from the pulse means 16 is applied to the circuit means 18, the impedance through the main conduction path of $Q_1$ increases relative to the impedance of the shunt path which is then established thereacross. Consequently, the portion of load current which flows through the shunt path increases until the main conduction path of $Q_1$ becomes substantially non-conductive and all of the load current flows through the shunt path. Then the turn-off signal from pulse means 16 is terminated to interrupt current flow through the shunt path and the load 14. Those skilled in the art should appreciate without further explanation that when the turn-off signal is initially applied, the shunt path across $Q_1$ may have a greater impedance than the main conduction path through $Q_1$ due to the increased impedance which is encountered through the main conduction path of $Q_1$ when gate current is drawn therefrom. Furthermore, both of the pulse means 12 and 16 may utilize $+V$ as their power source in the preferred embodiments of the invention, as will be explained later in this specification and therefore, only a single source is required to energize the load 14 and drive the switching network 10. Of course, $Q_1$ could be a plurality of GTO devices having their main conduction paths connected in parallel to conduct the load current and having their gates commonly connected to receive both the turn-on and turn-off signals.

Although many embodiments of the circuit means 18 are possible, the schematic diagram for one preferred embodiment thereof is illustrated in FIG. 1. In this embodiment, a first semiconductor switch 20 is disposed to draw current from the gate of $Q_1$ and a second semiconductor switch 22 is disposed to shunt load current around the main conduction path of $Q_1$. The control electrodes of both the first and second semiconductor switches 20 and 22 are connected to receive the turn-off signal from the pulse means 16. When this turn-off signal is applied, the first and second semiconductor switches 20 and 22 become conductive simultaneously. Then the impedance through the main conduction path of $Q_1$ starts to increase as a result of current being drawn from the gate of $Q_1$. Current flow through the second semiconductor switch 22 increases as the impedance through the main conduction path of $Q_1$ increases until such time as the anode current of $Q_1$ becomes zero and all of the load current flows through the second semiconductor switch 22. Thereafter, when the turn-off signal from the pulse means 16 is terminated, $Q_1$ remains non-conductive until the turn-on signal from pulse means 14 is agan applied. Characteristically, $Q_1$ has a high voltage rating and for practical purposes consequently, the voltage rating of the switching network 10 is dependent on the type of device utilized as the second semiconductor switch 22.

Figure 2:
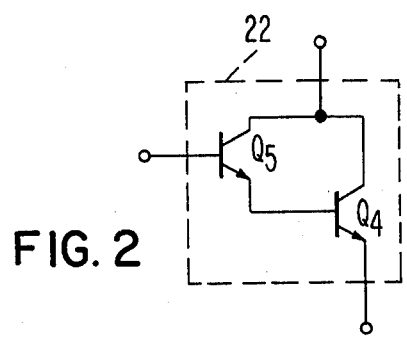
FIG. 2 shows an alternate embodiment for a portion of the circuit of FIG. 1.

Many different types of semiconductor switches could be utilized in the circuit means 18 such as transistors, SCR's or even other GTO's. For the embodiment shown in FIG. 1, bipolar transistors $Q_2$ and $Q_3$ are disposed as the first and second semiconductor switches 20 and 22 respectively. The gate of $Q_1$ is connected to the collector of $Q_2$ through a coil $L_1$ while the collector of $Q_3$ is connected to the anode of $Q_1$. The emitters of both $Q_2$ and $Q_3$ are commonly connected to a reference voltage such as ground, while their bases are both connected to receive the turn-off signal from the pulse means 16 through a resistor $R_1$. The magnitude of the turn-off signal from the pulse means 16 is predetermined to be sufficient to forward-bias both base-emitter junctions of $Q_2$ and $Q_3$ which become simultaneously conductive when that signal is applied to render $Q_1$ non-conductive in the manner previously described. The inductance of $L_1$ is small and it delays the application of the turn-off signal at the gate of $Q_1$ to cause that signal to ramp. $L_1$ is substantially grounded when $Q_2$ becomes conductive and therefore, it applies a negative bias at the gate of $Q_1$ after $Q_2$ becomes non-conductive. A combination of bipolar transistors could also be utilized for either semiconductor switch 20 or 22, such as where switch 20 includes the main conduction paths of bipolar transistors connected in parallel or where switch 22 includes a Darlington arrangement of bipolar transistors so that a high level of efficiency is maintained by the switching network 10. A Darlington circuit embodiment for semiconductor switch 22 is shown in FIG. 2 comprising transistors $Q_4$ and $Q_5$.

Those skilled in the arts will realize without further explanation that the switching network of this invention is disclosed herein by describing only a few embodiments thereof and numerous changes in the details of construction and the combination or arrangement of parts could be made in those described embodiments without departing from the true scope and spirit of the invention. Therefore, the embodiments described and shown in the drawing should be construed as illustrative rather than limiting.

What I claim is:

1. In a switching network of the type wherein at least one GTO device is rendered conductive or non-conductive to control the flow of current through a load, the improvement comprising:

first and second transistors, said first transistor having its main conduction path connected to conduct current away from the gate of the GTO device, said second transistor having its main conduction path connected in parallel with the main conduction path of the GTO device, said first and second transistors having their control electrodes commonly connected to receive the turn-off signal.

2. The switching network of claim 1 wherein said first and second transistors are NPN bipolar types, said first transistor having its collector connected to the gate of the GTO device through a coil and its emitter connected to the cathode of the GTO device, said second transistor having its collector connected to the anode of the GTO device and its emitter connected to the cathode of the GTO device, said first and second transistors having their base electrodes commonly connected to receive said turn-off signal.

3. The switching network of claim 1 wherein a third transistor is disposed in a Darlington arrangement with said second transistor.

* * * * *